(12) United States Patent
Costa

(10) Patent No.: US 9,397,635 B2
(45) Date of Patent: Jul. 19, 2016

(54) SEGMENTED ATTENUATOR WITH GLITCH REDUCTION

(71) Applicant: PEREGRINE SEMICONDUCTOR CORPORATION, San Diego, CA (US)

(72) Inventor: Damian Costa, San Diego, CA (US)

(73) Assignee: Peregrine Semiconductor Corporation, San Diego, CA (US)

(*) Notice: Subject to any disclaimer, the term of this patent is extended or adjusted under 35 U.S.C. 154(b) by 216 days.

(21) Appl. No.: 14/084,439

(22) Filed: Nov. 19, 2013

(65) Prior Publication Data

US 2015/0137913 A1    May 21, 2015

(51) Int. Cl.
*H03H 11/24* (2006.01)

(52) U.S. Cl.
CPC .................... *H03H 11/245* (2013.01)

(58) Field of Classification Search
CPC .................. H03H 11/245; H01P 1/22
USPC ........................................ 333/81 R
See application file for complete search history.

(56) References Cited

U.S. PATENT DOCUMENTS

2014/0002214 A1* 1/2014 Bawell ................ H01P 1/22
333/81 R

OTHER PUBLICATIONS

IDT F1953 Datasheet, "6-bit Digital Step Attenuator", 400 to 4000 MHz IDTF1953, Glitch-Free Digital Step Attenuator, Rev 1, May 2013, pp. 1-17.

* cited by examiner

*Primary Examiner* — Stephen E Jones
*Assistant Examiner* — Scott S Outten
(74) *Attorney, Agent, or Firm* — Jaquez Land Greenhaus LLP; Martin J. Jaquez, Esq.; John Land, Esq.

(57) ABSTRACT

A method and circuit for significantly reducing the switching transients of a digital step attenuator (DSA) by employing a segmented architecture that combines thermometer and binary coded stages. This approach reduces the number of attenuator stages switching at the same time and thus minimizes any glitch amplitude. Embodiments of a segmented DSA may be realized with "pi" and "bridged-T" attenuators, as well as with simple tuned L-pad attenuators combined in a resistor ladder network.

33 Claims, 6 Drawing Sheets

SEGMENTED ATTENUATOR WITH GLITCH REDUCTION

BACKGROUND (1) Technical Field

This invention generally relates to electronic circuits, and more specifically to digital step attenuator circuits.

(2) Background

An attenuator is an electronic device that reduces the power of a signal without appreciably distorting its waveform. Attenuators are usually passive devices made from simple voltage divider networks, and are frequently used to lower voltage, dissipate power, and/or to improve impedance matching. For example, in measuring signals, attenuators are used to lower the amplitude of a signal under test a known amount to enable measurements, or to protect the measuring device from signal levels that might damage it. Attenuators are also used to match impedance by lowering the apparent standing wave ratio (SWR).

Digital step attenuators (DSA's) are frequently used with radio frequency (RF) systems such as transceivers for broadcast radio, cellular telephones, and RF based digital networks (e.g., WiFi, Bluetooth). Typical DSA's consist of a series cascade of switchable (2-state), impedance-matched attenuator stages, whose attenuation values are binary weighted. For example, FIG. 1 is a schematic diagram of a typical prior art binary-weighted DSA 100. Shown are 7 attenuator stages formed of series-connected switchable (2-state) "pi" type attenuators 102 and "bridged-T" type attenuators 104.

In operation, a 7-bit binary code is applied to the control lines C16-C0.25 of the DSA 100 to select any or all of the attenuator stages 102, 104 to attenuate a signal between the input port RFin and the output port RFout, in equal increments (0.25 dB per step in this example). Thus, for the illustrated embodiment, a binary control signal of "0111111" will provide an attenuation (negative gain) of −15.75 dB, while a binary control signal of "1000000" will provide an attenuation of −16 dB. For the purpose of this disclosure, an ON attenuator stage is defined to be in "attenuation mode" to provide a designed attenuation level. Conversely, an OFF attenuator stage is bypassed to provide no attenuation and defined to be in "insertion loss mode".

FIG. 2 is a schematic diagram of a prior art "pi" switchable attenuator circuit 102. To turn the attenuator circuit 102 ON (attenuation mode), bypass switch 200 is opened and shunt switches 202, 204 are closed, resulting in a conventional "pi" type attenuator configuration. To turn the attenuator circuit 102 OFF (insertion loss mode), bypass switch 200 is closed and shunt switches 202, 204 are opened, effectively bypassing the entire attenuator circuit 102. The attenuation characteristics of a "pi" type attenuator are well known to those skilled in the art.

FIG. 3 is a schematic diagram of a prior art "bridged T" switchable attenuator circuit 104. To turn the attenuator circuit 104 ON (attenuation mode), bypass switch 300 is opened and shunt switch 302 is closed, resulting in a conventional "bridged T" type attenuator configuration. To turn the attenuator circuit 104 OFF (insertion loss mode), bypass switch 300 is closed and shunt switch 302 is opened, effectively bypassing the entire attenuator circuit 104. The attenuation characteristics of a "bridged T" type attenuator are well known to those skilled in the art.

A problem with a binary-weighted DSA 100 using "pi" switchable attenuator stages 102 and "bridged T" switchable attenuator stages 104 is that the component switching elements in the attenuator stages do not turn ON and OFF at the same rate. For field effect transistor (FET's) used as the switching elements, typically the turn on time is faster than the turn off time. This creates a scenario whereby various attenuator stages can temporarily present less attenuation as they are changing states. This asymmetrical switching produces a transient glitch at the DSA output, which can degrade the performance of a feedback communication system in which such a DSA is embedded. For example, to program the example 7-bit DSA 100 from 15.75 dB attenuation to 16 dB attenuation would require toggling all seven of the control bits C16-C0.25 simultaneously as shown in Table 1:

TABLE 1

| decimal code | C16 | C8 | C4 | C2 | C1 | C0.5 | C0.25 | Ideal Gain (db) |
|---|---|---|---|---|---|---|---|---|
| 59 | 0 | 1 | 1 | 1 | 1 | 1 | 1 | −15.75 |
| 60 | 1 | 0 | 0 | 0 | 0 | 0 | 0 | −16.00 |

As a result of such asymmetric switching, such binary-weighted DSA's suffer from switching transients (glitches) during some code transitions because various attenuator stages simultaneously toggle with different turn-on/turn-off transient responses. For example, FIG. 4 is a diagram showing a switching glitch generated by a typical example of the prior art circuit shown in FIG. 1, for a worst case state transition. In this example, the measured glitch amplitude 400 in switching from one attenuation value 402 to another attenuation value 404 is larger than about 6 dB. When such a DSA is part of an automatic gain control loop (AGC) used to compensate for variations in received signal strength, such glitches may introduce an unwanted detection error.

Attempts have been made to introduce timing delay elements into binary-weighted DSA's to control the sequencing of the attenuator stage switching elements. However, such approaches eliminate positive glitches, but still suffer from large negative glitches. Furthermore, the introduction of a delay has the drawback that it increases the switching time for the DSA as a whole.

Accordingly, there is a need for a digital step attenuator circuit that reduces the amplitude of switching transients (glitches) during code transitions, and which reduces both positive and negative glitches. The present invention addresses this need.

SUMMARY OF THE INVENTION

The invention is a method and circuit for significantly reducing the switching transients (glitches) (both positive and negative) of digital step attenuators (DSA's) by employing a segmented DSA architecture that combines thermometer and binary coded stages. This approach reduces the number of attenuator stages switching at the same time and thus minimizes any glitch amplitude.

A segmented architecture reduces the number of simultaneously switched attenuators, but the total number of stages is increased. Thus, while embodiments of a segmented DSA may be realized with the same type of attenuator stages as in a purely binary-weighted DSA, the integrated circuit die ("chip") area may increase. Accordingly, in one embodiment, simple L-pad attenuators, each consisting of only four components, are combined in a resistor ladder network, as opposed to the series cascade of conventional attenuator stages, which typically contain six components per stage. The resistor ladder configuration thus aids in alleviating the physical constraints imposed by a segmented architecture.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

The invention is a method and circuit for significantly reducing switching transients (glitches) (both positive and negative) of digital step attenuators (DSA's) by employing a segmented DSA architecture that combines thermometer and binary coded stages. This approach reduces the number of attenuator stages switching at the same time and thus minimizes any glitch amplitude.

A segmented architecture reduces the number of simultaneously switched attenuators, but the total number of stages is increased. Thus, while embodiments of a segmented DSA may be realized with the same type of attenuator stages as in a purely binary-weighted DSA, the integrated circuit die ('chip') area may increase. Accordingly, in one embodiment, simple L-pad attenuators, each consisting of only four components, are combined in a resistor ladder network, as opposed to the series cascade of conventional attenuator stages, which typically contain six components per stage. The resistor ladder configuration thus aids in alleviating the physical constraints imposed by a segmented architecture.

More specifically, embodiments of the invention significantly reduce the amplitude of switching glitches in DSA's by replacing the binary-weighted cascade of attenuators of prior art DSA designs with a segmented DSA architecture that combines binary and thermometer encoded stages. Thermometer encoding is simply an incremental or decremental change in output value with each unit of change of an input, similar to a conventional mercury thermometer. Thus, for example, an 8-stage thermometer encoded segment can be set to from 1 to 8 units of attenuation (plus zero attenuation, when completely bypassed).

Figure 5:
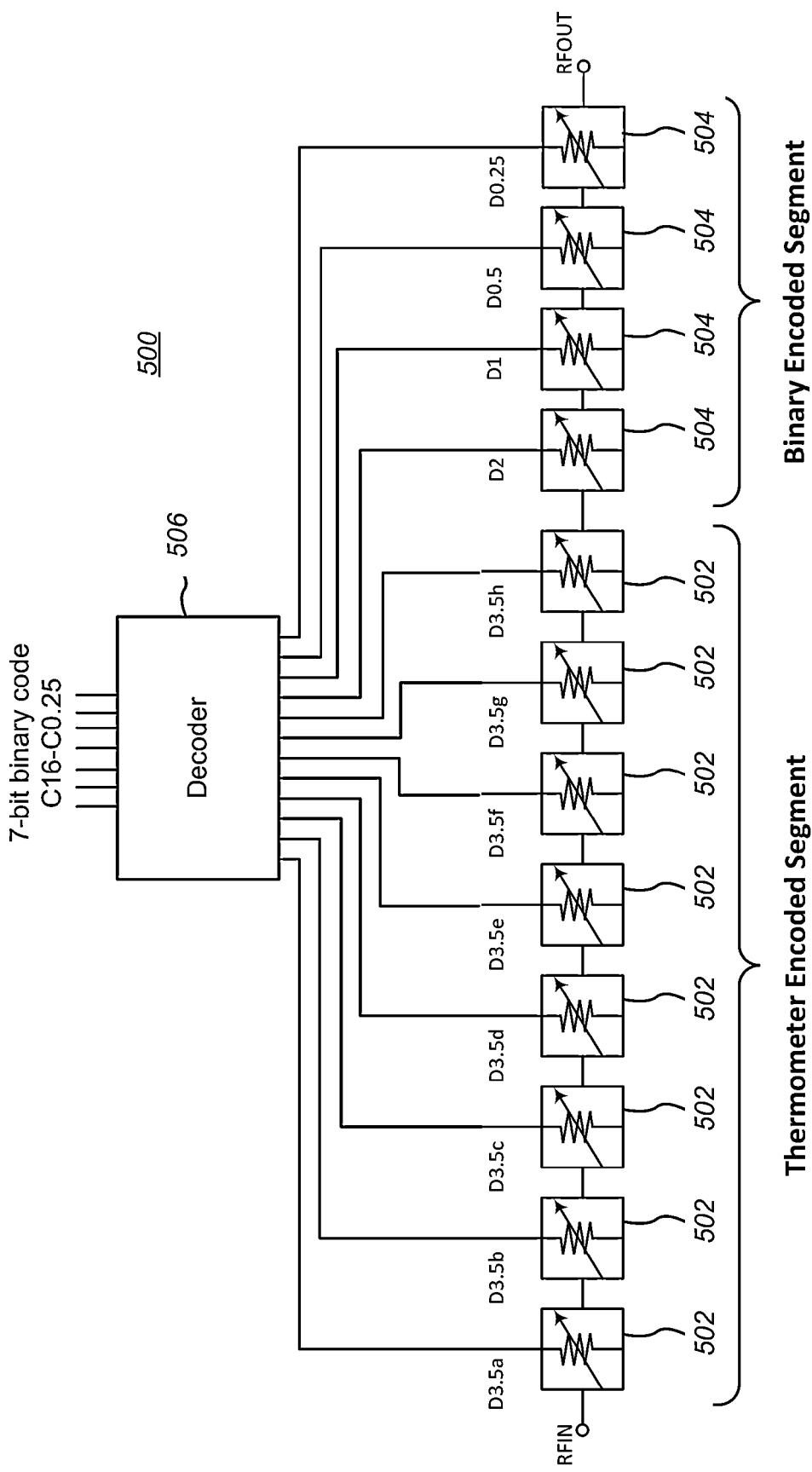
FIG. 5 is a schematic diagram of a segmented DSA attenuator in accordance with the invention.

FIG. 5 is a schematic diagram of a segmented DSA attenuator in accordance with the invention. The illustrated configuration is a segmented 7-bit DSA 500 having eight thermometer encoded attenuator stages 502 (3.5 dB most significant bits, or "MSBs", per stage) and four binary encoded attenuator stages 504 (2, 1, 0.5, and 0.25 dB least significant bits, or "LSBs").

A digital decoder 506 converts input binary coded control signals (C16, C8, C4, C2, C1, C0.5, C0.25) to the required control signals for two segments of attenuator stages (D3.5a, D3.5b, D3.5c. D3.5d, D3.5e. D3.5f. D3.5g, D3.5h for the thermometer encoded segment, and D2, D1, D0.5, and D0.25 for the binary encoded segment).

In the illustrated embodiment, the step size of 0.25 dB and maximum attenuation of −31.75 dB are the same values as those of a conventional binary-encoded 7-bit DSA having a similar LSB of 0.25 dB of attenuation. Importantly, the segmented DSA architecture of the present invention mitigates transient glitches by reducing the number of stages toggling during a code transition. For example, when the attenuation of the illustrated segmented 7-bit DSA transitions from −15.75 to −16 dB, only four stages toggle simultaneously, as shown in Table 2:

TABLE 2

| decimal code | D3.5a | D3.5b | D3.5c | D3.5d | D3.5e | D3.5f | D3.5g | D3.5h | D2 | D1 | D0.5 | D0.25 | Ideal Gain (dB) |
|---|---|---|---|---|---|---|---|---|---|---|---|---|---|
| 63 | 1 | 1 | 1 | 1 | 0 | 0 | 0 | 0 | 0 | 1 | 1 | 1 | −15.75 |
| 64 | 1 | 1 | 1 | 1 | 0 | 0 | 0 | 0 | 1 | 0 | 0 | 0 | −16.00 |

It should be noted that for the −15.75 to −16 dB transition, no MSB bit is toggled. For the eight attenuation state code transitions in the illustrated embodiment in which an MSB toggles, there is still a maximum of four stages changing simultaneously. Table 3 illustrates one of these worst case state changes, in which the DSA transitions from −3.25 to −3.50 dB:

TABLE 3

| decimal code | D3.5a | D3.5b | D3.5c | D3.5d | D3.5e | D3.5f | D3.5g | D3.5h | D2 | D1 | D0.5 | D0.25 | Ideal Gain (dB) |
|---|---|---|---|---|---|---|---|---|---|---|---|---|---|
| 13 | 0 | 0 | 0 | 0 | 0 | 0 | 0 | 0 | 1 | 1 | 0 | 1 | −3.25 |
| 14 | 1 | 0 | 0 | 0 | 0 | 0 | 0 | 0 | 0 | 0 | 0 | 1 | −3.50 |

Thus, compared to a maximum of seven bits toggling with a binary-weighted DSA, the segmented DSA the embodiment illustrated in FIG. 5 has a maximum of four bits toggling. Furthermore, since the segmented DSA employs stages more similar in attenuation value compared to the binary-weighted DSA, the switching asymmetry tends to be less.

While conventional binary encoding is illustrated for the binary encoded segment, other coding schemes may be used. Further, while conventional constant-unit thermometer encoding may be used, non-constant units may be used. In addition, two or more thermometer encoded segments may be used, each having different unit sizes (e.g., 5 dB per unit in a first segment, and 3.5 dB per unit in a second segment).

In general, the thermometer encoded attenuator stages 502 and binary encoded attenuator stages 504 shown in the segmented DSA embodiment illustrated in FIG. 5 may be of any conventional design, including "pi" type and "bridged T" type attenuators. However, when implementing actual circuits, particularly integrated circuits (ICs), optimum RF performance requires minimized layout parasitic impedances in the signal path and low ground inductances. As a result, circuit cells for DSA attenuator stages are commonly laid out in a single row from input to output along one edge of an IC die, with attenuator grounds positioned next to the nearby die edge. If a segmented DSA in accordance with the present invention employs "pi" type and "bridged T" type attenuators, then the increased number of stages of the segmented architecture poses a chip area constraint. Accordingly, one embodiment of the present invention uses L-pad attenuators instead of "pi" type and "bridged T" type attenuators to compensate for the larger number of stages in the segmented DSA architecture. An L-pad attenuator stage requires fewer components than conventional "pi" type and "bridged T" type attenuator stages.

Figure 2:
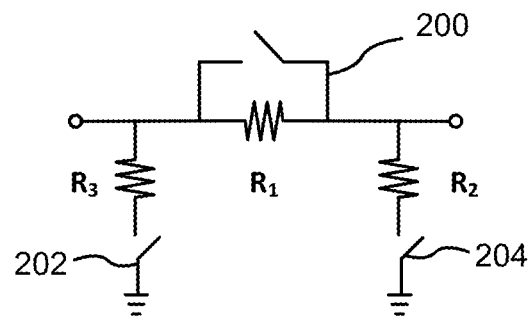
FIG. 2 is a schematic diagram of a prior art "pi" switchable attenuator circuit.
Figure 3:
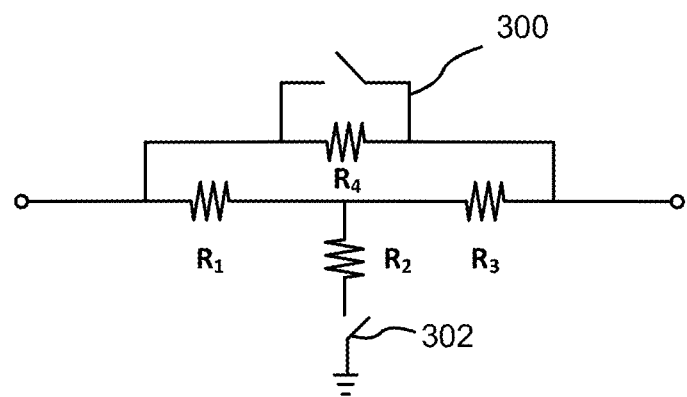
FIG. 3 is a schematic diagram of a prior art "bridged T" switchable attenuator circuit.
Figure 6:
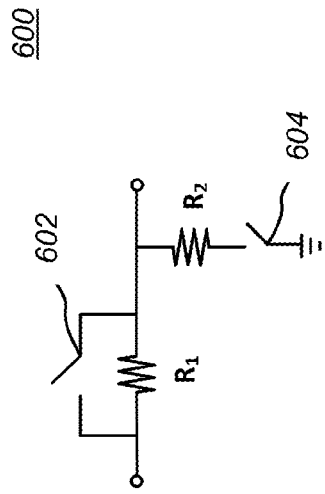
FIG. 6 is a schematic diagram of an "L-pad" attenuator circuit.

FIG. 6 is a schematic diagram of an "L-pad" attenuator circuit 600, which basically consists of a switchable (2-state) voltage divider circuit formed by two resistors, R1 and R2, connected as shown. To turn the attenuator circuit 600 ON (attenuation mode), bypass switch 602 is opened and shunt switch 604 is closed, resulting in a conventional "L-pad" type attenuator configuration. To turn the attenuator circuit 600 OFF (insertion loss mode), bypass switch 602 is closed and shunt switch 604 is opened, effectively bypassing the entire attenuator circuit 600. The attenuation characteristics of an "L-pad" type attenuator are well known to those skilled in the art. The L-pad attenuator depicted in FIG. 6 only requires four components compared to six components in the "pi" type attenuator (FIG. 2) and six components in the "bridged T" type attenuator (FIG. 3).

Figure 7:
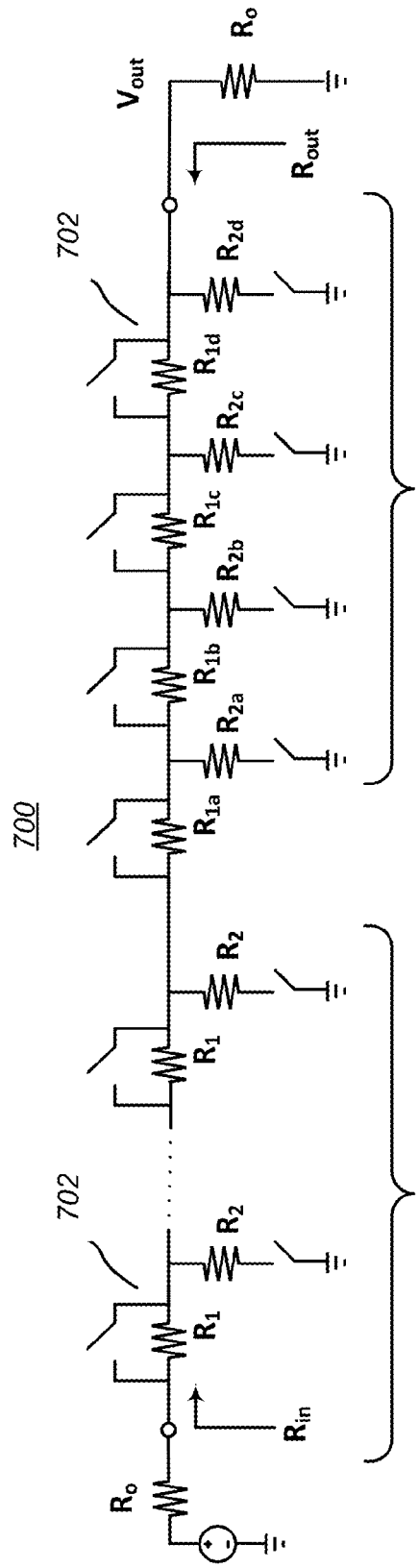
FIG. 7 is a schematic diagram of a segmented singly-tapped L-pad based resistor ladder DSA attenuator in accordance with the invention.

FIG. 7 is a schematic diagram of a segmented singly-tapped L-pad based resistor ladder DSA attenuator 700 in accordance with the invention, using series cascading L-pad attenuators 702 for all stages of an eight stage thermometer encoded segment (only two stages are shown) and a four stage binary encoded segment. By appropriately scaling resistors R1 and R2 of each L-pad attenuator 702, each stage can simultaneously provide any desired attenuation and produce an input impedance equal to the characteristic impedance Ro. For example, each L-pad attenuator 702 stage in the thermometer encoded segment may have R1 and R2 set so as to provide an attenuation of 3.5 dB MSBs per stage, while each L-pad attenuator 702 stage in the binary encoded segment may have R1 and R2 set so as to provide respective LSB attenuation values of 2, 1, 0.5, and 0.25 dB.

For the L-pad based attenuator embodiment shown in FIG. 7, the step attenuation (negative gain G) in dB can be expressed as $G_{dB}=20 \log G=20 \log [(R2\|Ro)/(R1+R2\|Ro)]$ and the input resistance of each stage is $Rin=R1+R2\|Ro=Ro$. A short algebraic manipulation can show that $R2=Ro*G/(1-G)$ and $R1=Ro-(R2\|Ro)$. Unlike the symmetrical "pi" type and "bridged T" type attenuator topologies which can simultaneously perfectly (ideally) match their input and output impedances to Ro, the output impedances of the asymmetrical L-pad attenuators are not perfectly matched to Ro when they are configured in a resistor ladder as shown in FIG. 7. However, it can be easily shown that for reasonably small attenuation values, the resulting output resistance Rout of each L-pad attenuator 702 is close enough to Ro to yield an adequate output match. For example, for Ro=50 ohms, Table 4 summarizes the resistance values R1 and R2 for each L-pad attenuator of the example segmented DSA in FIG. 7, as well as the calculated output resistance of each attenuator.

TABLE 4

| $G_{db}$ | R1 (ohms) | R2 (ohms) | Rout (ohms) |
|---|---|---|---|
| −0.25 | 1.42 | 1712.30 | 49.92 |
| −0.50 | 2.80 | 843.83 | 49.69 |
| −1.0 | 5.44 | 409.77 | 48.83 |
| −2.0 | 10.28 | 193.11 | 45.94 |
| −3.5 | 16.58 | 100.76 | 40.09 |

The embodiment in FIG. 7 is referred to as "singly-tapped" because the output is only taken at the output of the last stage, at Vout. However, alternative embodiments may provide additional outputs, or "taps", between some or all of the other L-pad attenuator 702 stages.

Figure 1:
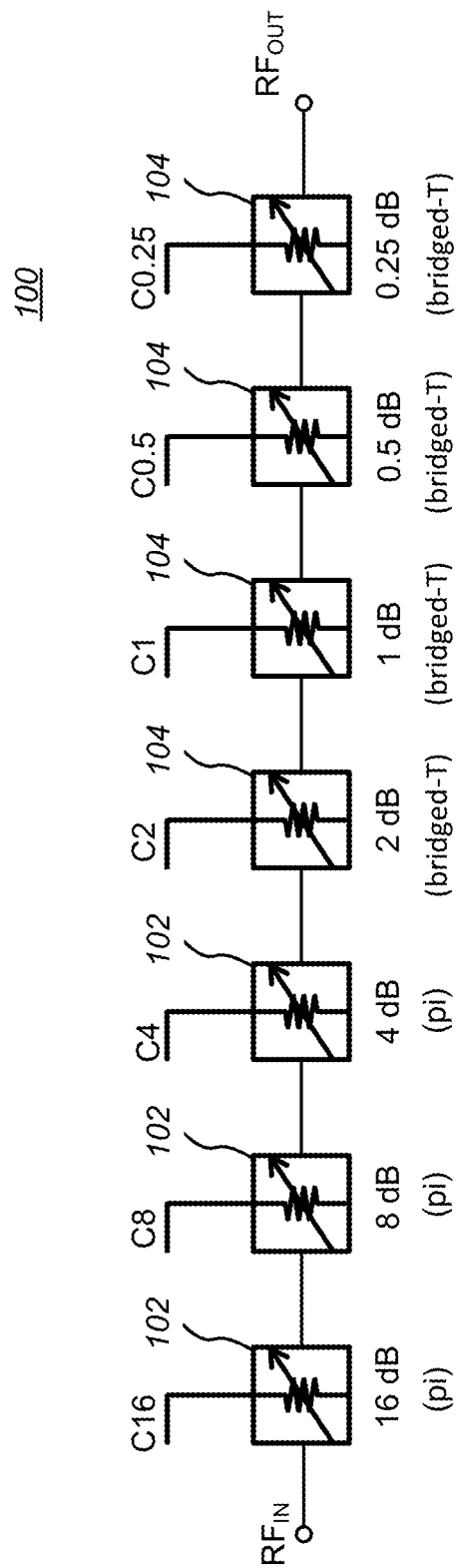
FIG. 1 is a schematic diagram of a typical prior art binary-weighted digital step attenuator.
Figure 4:
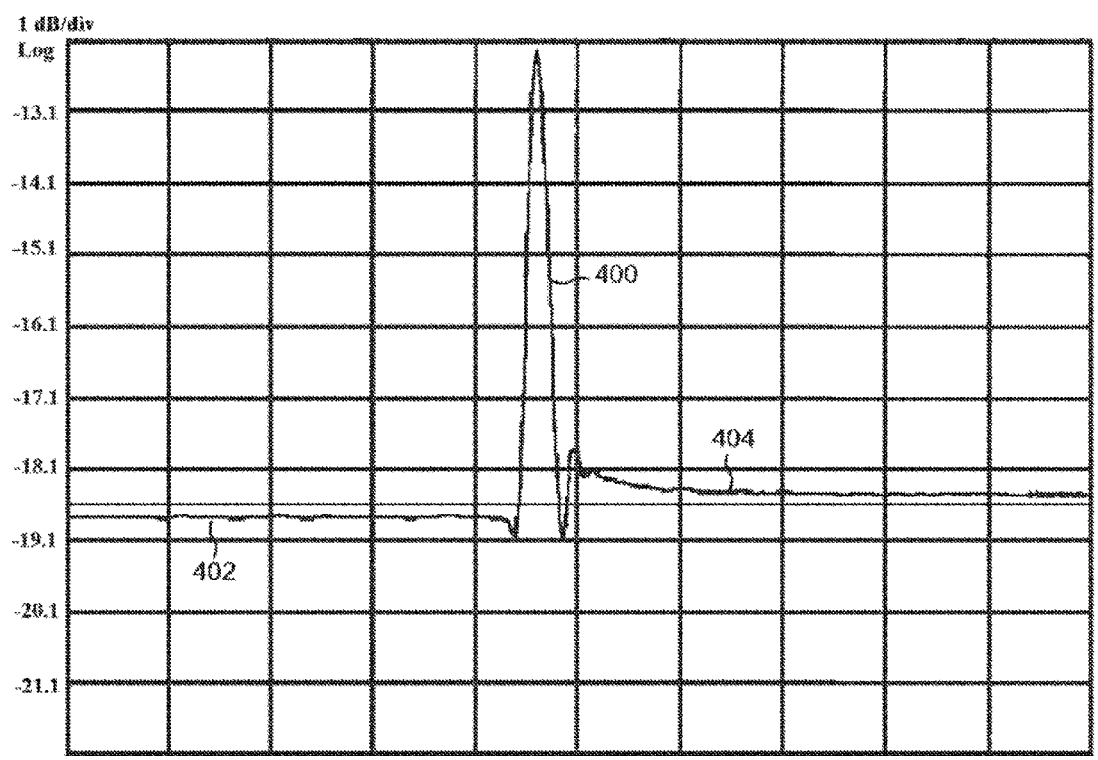
FIG. 4 is a diagram showing a switching glitch generated by a typical example of the prior art circuit shown in FIG. 1.
Figure 8:
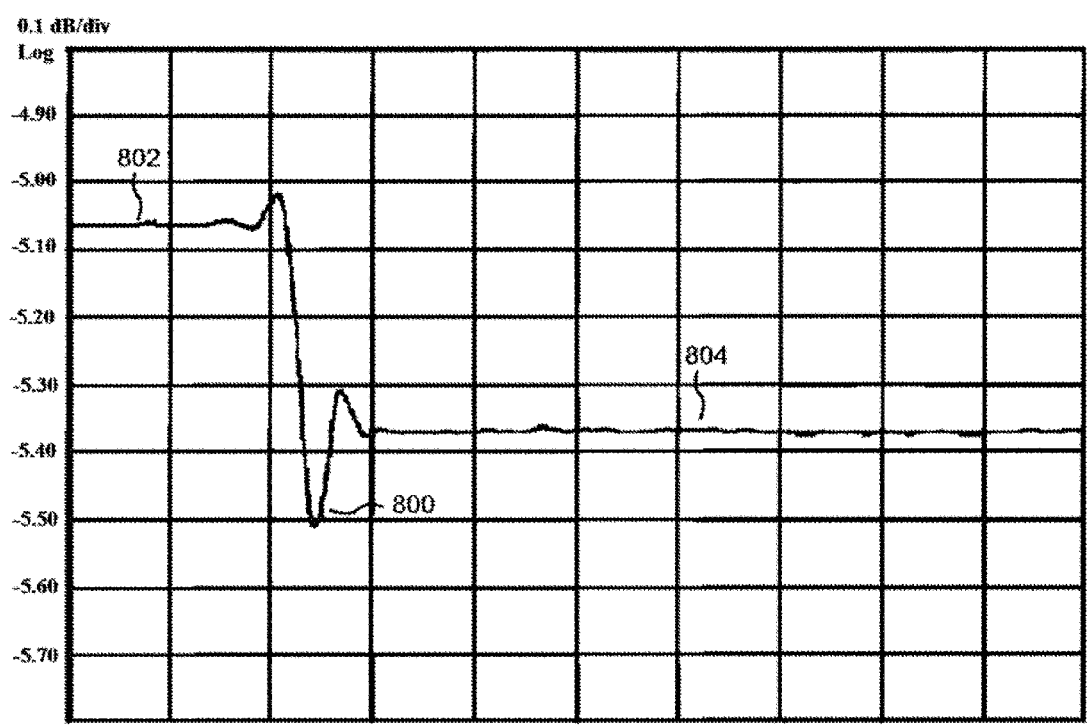
FIG. 8 is a diagram showing a minimized switching glitch typically generated by the circuit shown in FIG. 7.

The effectiveness of the segmented resistor ladder DSA architecture for reducing switching glitches can be shown by simulating the transient response at the worst case code changes. FIG. 8 is a diagram showing a minimized switching glitch 800 typically generated by the circuit shown in FIG. 7, depicting the transient response when the attenuation code is changed from a first level 802 of attenuation (−3.25 dB in this example) to a second level 804 of attenuation (−3.5 dB in this example; see also Table 3). As can be seen in FIG. 8, the magnitude of both the positive and negative glitches at this worst case transition have been reduced below 0.15 dB. This glitch amplitude is significantly better than the approximately 6 dB glitch amplitude shown in FIG. 4 that is generated by the prior art circuit shown in FIG. 1. Note that the vertical axes in both FIG. 4 and FIG. 8 are absolute attenuations, not attenuations relative to the reference state (attenuation setting=0 dB), and include the loss from circuit board traces.

Unlike some prior art designs, embodiments of the present invention mitigate both positive and negative glitches. Furthermore, such embodiments do so without introducing additional delay which results in a slower switching time. In one embodiment tested to generate FIG. 8, the switching time of the example DSA was less than 400 ns.

Another advantage of a segmented DSA in accordance with embodiments of the present invention is that attenuator step accuracy is improved compared to a purely binary-weighted DSA when the MSB's are thermometer encoded. Furthermore, in the segmented DSA embodiment illustrated in FIG. 5, since the MSB (3.5 dB in the example) is much closer in attenuation value to the LSB (0.25 dB in the example) compared to the MSB of 16 dB for a purely binary DSA having comparable overall attenuation levels, both the circuit and the layout of the segmented MSB's are more similar to the circuit and the layout of the LSB's. As a result, the monotonicity of a segmented DSA is expected to be better than that of the binary encoded DSA.

This disclosure includes embodiments of a segmented DSA with specific partitioning of thermometer and binary encoded attenuator segments. Other embodiments are possible with different segmentations. The embodiment shown in FIG. 5 also positions the attenuator cells in a particular order from input to output, but other embodiments are possible with the order of these attenuator cells reconfigured; for example, the thermometer encoded stages may be inserted in any order in the series cascade. Moreover, while the attenuator stages have been described as being "pi" type, "bridged T" type, and "L-pad" type attenuators, other embodiments of the inventive segmented DSA architecture may include other types of passive or active attenuators.

Another aspect of the invention includes a method for reducing glitches in a digital step attenuator, including the steps of:

STEP 1: providing at least one segment of thermometer encoded attenuators;

STEP 2: providing at least one segment of binary encoded attenuators coupled in series with the at least one segment of thermometer encoded attenuators;

STEP 3: applying a set of control signals to the segments of thermometer encoded attenuators and binary encoded attenuators to select an attenuation level for an input signal applied to the series coupled segments.

Yet another aspect of the invention includes the above method where at least one segment of thermometer encoded attenuators corresponds to the most significant bits represented by the control signals.

As should be readily apparent to one of ordinary skill in the art, the invention can be implemented to meet a wide variety of possible specifications. Thus, selection of suitable component values are a matter of design choice. The switching and passive elements may be implemented in any suitable IC technology, including but not limited to MOSFET and IGFET structures. Integrated circuit embodiments may be fabricated using any suitable substrates and processes, including but not limited to standard bulk silicon, silicon-on-insulator (SOI), and silicon-on-sapphire (SOS) processes.

A number of embodiments of the invention have been described. It is to be understood that various modifications may be made without departing from the spirit and scope of the invention. For example, some of the steps described above may be order independent, and thus can be performed in an order different from that described. It is to be understood that the foregoing description is intended to illustrate and not to limit the scope of the invention, which is defined by the scope of the following claims, and that other embodiments are within the scope of the claims.

What is claimed is:

1. A segmented digital step attenuator circuit, including:
   (a) at least one first segment comprising a plurality of individual thermometer encoded L-pad type bypassable attenuator circuits; and
   (b) at least one second segment comprising a plurality of individual binary encoded L-pad type bypassable attenuator circuits coupled in series with the at least one first segment of individual thermometer encoded L-pad type bypassable attenuator circuits;
   wherein applying a set of individual control signals to the first segments of individual thermometer encoded L-pad type bypassable attenuator circuits and a set of binary encoded control signals to the second segments of individual binary encoded L-pad type bypassable attenuator circuits selects an attenuation level for an input signal applied to the series coupled first and second segments.

2. The segmented digital step attenuator circuit of claim 1, further including a decoder circuit for converting an applied binary encoded control signal into the set of binary encoded control signals and the set of individual control signals.

3. The segmented digital step attenuator circuit of claim 1, wherein one of the at least one first segment comprising the plurality of individual thermometer encoded L-pad type bypassable attenuator circuits comprises the most significant bits of attenuation selectable by the set of individual control signals.

4. The segmented digital step attenuator circuit of claim 1, wherein each L-pad type bypassable attenuator circuit includes paired resistors R1 and R2, and wherein the resistance values of R1 and R2 are sized to provide a selected attenuation value for such L-pad type bypassable attenuator circuit and an input impedance for such L-pad type bypassable attenuator circuit approximately equal to a characteristic impedance of the input signal.

5. A method for reducing switching transients in a digital step attenuator, including the steps of:
   (a) providing at least one first segment comprising a plurality of individual thermometer encoded L-pad type bypassable attenuator circuits;
   (b) providing at least one second segment comprising a plurality of individual binary encoded L-pad type bypassable attenuator circuits coupled in series with the at least one first segment of individual thermometer encoded L-pad type bypassable attenuator circuits; and
   (c) applying a set of individual control signals to the first segments of individual thermometer encoded L-pad type bypassable attenuator circuits and a set of binary encoded control signals to the second segments of individual binary encoded L-pad type bypassable attenuator circuits selects an attenuation level for an input signal applied to the series coupled first and second segments.

6. The method of claim 5, further including the step of converting an applied binary encoded control signal into the set of binary encoded control signals and the set of individual control signals.

7. The method of claim 5, wherein one of the at least one first segment comprising the plurality of individual thermometer encoded L-pad type bypassable attenuator circuits comprises the most significant bits of attenuation selectable by the set of individual control signals.

8. The method of claim 5, wherein each L-pad type bypassable attenuator circuit includes paired resistors R1 and R2, and wherein the resistance values of R1 and R2 are sized to provide a selected attenuation value for such L-pad type bypassable attenuator circuit and an input impedance for such L-pad type bypassable attenuator circuit approximately equal to a characteristic impedance for an applied input signal.

9. A segmented digital step attenuator circuit, including:
   (a) at least one first segment comprising a plurality of individual thermometer encoded L-pad type bypassable attenuator circuits; and
   (b) at least one second segment comprising a plurality of individual binary encoded L-pad type bypassable attenuator circuits coupled in series with the at least one first segment of individual thermometer encoded L-pad type bypassable attenuator circuits;
   wherein applying a set of control signals to the first segments of individual thermometer encoded L-pad type bypassable attenuator circuits and to the second segments of individual binary encoded L pad type bypassable attenuator circuits selects an attenuation level for an input signal applied to the series coupled first and second segments.

10. The segmented digital step attenuator circuit of claim 9, wherein one of the at least one first segment comprising the plurality of individual thermometer encoded L-pad type bypassable attenuator circuits comprises the most significant bits of attenuation selectable by the set of control signals.

11. The segmented digital step attenuator circuit of claim 9, wherein each L-pad type bypassable attenuator circuit includes paired resistors R1 and R2, and wherein the resistance values of R1 and R2 are sized to provide a selected attenuation value for such L-pad type bypassable attenuator circuit and an input impedance for such L-pad type bypassable attenuator circuit approximately equal to a characteristic impedance of the input signal.

12. A segmented digital step attenuator circuit, including:
(a) at least one first segment comprising a plurality of individual thermometer encoded L-pad type bypassable attenuator circuits, each first segment responsive to an applied set of individual control signals to select from zero to all of such individual thermometer encoded L-pad type bypassable attenuator circuits within such first segment; and
(b) at least one second segment comprising a plurality of individual binary encoded L-pad type bypassable attenuator circuits coupled in series with the at least one first segment of individual thermometer encoded L-pad type bypassable attenuator circuits, each second segment responsive to an applied set of binary encoded control signals to select a binary combination of such individual binary encoded L-pad type bypassable attenuator circuits.

13. The segmented digital step attenuator circuit of claim 12, wherein one of the at least one first segment comprising the plurality of individual thermometer encoded L-pad type bypassable attenuator circuits comprises the most significant bits of attenuation of the segmented digital step attenuator circuit.

14. The segmented digital step attenuator circuit of claim 12, wherein each L-pad type bypassable attenuator circuit includes paired resistors R1 and R2, and wherein the resistance values of R1 and R2 are sized to provide a selected attenuation value for such L-pad type bypassable attenuator circuit and an input impedance for such L-pad type bypassable attenuator circuit approximately equal to a characteristic impedance of an applied input signal.

15. A segmented digital step attenuator circuit, including:
(a) at least one first segment of series cascaded, thermometer encoded L-pad type bypassable attenuators, each first segment responsive to an applied set of individual control signals to select from zero to all of such thermometer encoded L-pad type bypassable attenuators within such first segment;
(b) at least one second segment of series cascaded, binary encoded L-pad type bypassable attenuators coupled in series with the at least one first segment of thermometer encoded L-pad type bypassable attenuators, each second segment responsive to an applied set of binary encoded control signals to select a binary combination of such binary encoded L-pad type bypassable attenuators; and
(c) a decoder circuit for converting an applied binary encoded control signal into the set of binary encoded control signals and the set of individual control signals.

16. The segmented digital step attenuator circuit of claim 15, wherein the segmented digital step attenuator circuit is part of an integrated circuit.

17. The segmented digital step attenuator circuit of claim 15, wherein each L-pad type bypassable attenuator circuit includes paired resistors R1 and R2, and wherein the resistance values of R1 and R2 are sized to provide a selected attenuation value for such L-pad type bypassable attenuator circuit and an input impedance for such L-pad type bypassable attenuator circuit approximately equal to a characteristic impedance of an applied input signal.

18. A segmented digital step attenuator circuit, including:
(a) first signal attenuator means, including at least one segment of individual thermometer encoded L-pad type bypassable attenuator circuits, for selecting from zero to all of such individual thermometer encoded L-pad type bypassable attenuator circuits to attenuate an applied signal; and
(b) second signal attenuator means, including at least one segment of individual binary encoded L-pad type bypassable attenuator circuits and coupled in series with the first signal attenuator means, for selecting a binary combination of such binary encoded attenuators to attenuate the applied signal.

19. The segmented digital step attenuator circuit of claim 18, wherein one segment of individual thermometer encoded L-pad type bypassable attenuator circuits comprises the most significant bits of attenuation of the segmented digital step attenuator circuit.

20. The segmented digital step attenuator circuit of claim 18, wherein each L-pad type bypassable attenuator circuit includes paired resistors R1 and R2, and wherein the resistance values of R1 and R2 are sized to provide a selected attenuation value for such L-pad type bypassable attenuator circuit and an input impedance for such L-pad type bypassable attenuator circuit approximately equal to a characteristic impedance of the applied signal.

21. A segmented digital step attenuator circuit, including:
(a) first signal attenuator means, including a plurality of series connected individual thermometer encoded L-pad type bypassable attenuator circuits responsive to an applied set of individual control signals, for selecting from zero to all such individual thermometer encoded L-pad type bypassable attenuator circuits to attenuate an applied signal; and
(b) second signal attenuator means, including a plurality of series connected individual binary encoded L-pad type bypassable attenuator circuits and coupled in series with the first signal attenuator means and responsive to an applied set of binary encoded control signals, for selecting a binary combination of such binary encoded attenuators to attenuate the applied signal.

22. The segmented digital step attenuator circuit of claim 21, wherein one segment of series connected individual thermometer encoded L-pad type bypassable attenuator circuits comprises the most significant bits of attenuation of the segmented digital step attenuator circuit.

23. The segmented digital step attenuator circuit of claim 21, wherein each L-pad type bypassable attenuator circuit includes paired resistors R1 and R2, and wherein the resistance values of R1 and R2 are sized to provide a selected attenuation value for such L-pad type bypassable attenuator circuit and an input impedance for such L-pad type bypassable attenuator circuit approximately equal to a characteristic impedance of the applied signal.

24. A method for reducing switching transients in a digital step attenuator, including the steps of:
(a) providing at least one first segment comprising a plurality of individual thermometer encoded L-pad type bypassable attenuator circuits;
(b) providing at least one second segment comprising a plurality of individual binary encoded L-pad type bypassable attenuator circuits coupled in series with the at least one first segment of individual thermometer encoded L-pad type bypassable attenuator circuits; and
(c) applying a set of control signals to the first segments of individual thermometer encoded L-pad type bypassable attenuator circuits and to the second segments of individual binary encoded L-pad type bypassable attenuator circuits selects an attenuation level for an input signal applied to the series coupled first and second segments.

25. The method of claim 24, wherein one of the at least one first segment comprising the plurality of individual thermometer encoded L-pad type bypassable attenuator circuits comprises the most significant bits of attenuation selectable by the set of control signals.

26. The method of claim 24, wherein each L-pad type bypassable attenuator circuit includes paired resistors R1 and R2, and wherein the resistance values of R1 and R2 are sized to provide a selected attenuation value for such L-pad type bypassable attenuator circuit and an input impedance for such L-pad type bypassable attenuator circuit approximately equal to a characteristic impedance of the input signal.

27. A method for reducing switching transients in a digital step attenuator, including the steps of:
  (a) providing at least one first segment comprising a plurality of individual thermometer encoded L-pad type bypassable attenuator circuits, each first segment responsive to an applied set of individual control signals to select from zero to all of such individual thermometer encoded L-pad type bypassable attenuator circuits within such first segment; and
  (b) providing at least one second segment comprising a plurality of individual binary encoded L-pad type bypassable attenuator circuits coupled in series with the at least one first segment of individual thermometer encoded L-pad type bypassable attenuator circuits, each second segment responsive to an applied set of binary encoded control signals to select a binary combination of such individual binary encoded L-pad type bypassable attenuator circuits.

28. The method of claim 27, wherein one of the at least one first segment comprising the plurality of individual thermometer encoded L-pad type bypassable attenuator circuits comprises the most significant bits of attenuation selectable by the set of individual control signals.

29. The method of claim 27, wherein each L-pad type bypassable attenuator circuit includes paired resistors R1 and R2, and wherein the resistance values of R1 and R2 are sized to provide a selected attenuation value for such L-pad type bypassable attenuator circuit and an input impedance for such L-pad type bypassable attenuator circuit approximately equal to a characteristic impedance for an applied input signal.

30. A method for reducing switching transients in a digital step attenuator, including the steps of:
  (a) providing at least one first segment of series cascaded, thermometer encoded L-pad type bypassable attenuators, each first segment responsive to an applied set of individual control signals to select from zero to all of such thermometer encoded L-pad type bypassable attenuators within such first segment;
  (b) providing at least one second segment of series cascaded, binary encoded L-pad type bypassable attenuators coupled in series with the at least one first segment of thermometer encoded L-pad type bypassable attenuators, each second segment responsive to an applied set of binary encoded control signals to select a binary combination of such binary encoded L-pad type bypassable attenuators; and
  (c) converting an applied binary encoded control signal into the set of binary encoded control signals and the set of individual control signals.

31. The method of claim 30, wherein each L-pad type bypassable attenuator circuit includes paired resistors R1 and R2, and wherein the resistance values of R1 and R2 are sized to provide a selected attenuation value for such L-pad type bypassable attenuator circuit and an input impedance for such L-pad type bypassable attenuator circuit approximately equal to a characteristic impedance of an applied input signal.

32. A method for reducing switching transients in a digital step attenuator, including the steps of:
  (a) providing on an integrated circuit at least one first segment of series cascaded, thermometer encoded L-pad type bypassable attenuators, each first segment responsive to an applied set of individual control signals to select from zero to all of such thermometer encoded L-pad type bypassable attenuators within such first segment;
  (b) providing on an integrated circuit at least one second segment of series cascaded, binary encoded L-pad type bypassable attenuators coupled in series with the at least one first segment of thermometer encoded L-pad type bypassable attenuators, each second segment responsive to an applied set of binary encoded control signals to select a binary combination of such binary encoded L-pad type bypassable attenuators; and
  (c) providing on an integrated circuit a decoder circuit for converting an applied binary encoded control signal into the set of binary encoded control signals and the set of individual control signals.

33. The method of claim 32, wherein each L-pad type bypassable attenuator circuit includes paired resistors R1 and R2, and wherein the resistance values of R1 and R2 are sized to provide a selected attenuation value for such L-pad type bypassable attenuator circuit and an input impedance for such L-pad type bypassable attenuator circuit approximately equal to a characteristic impedance of an applied input signal.

* * * * *